United States Patent
Eralp

(10) Patent No.: US 11,841,626 B2
(45) Date of Patent: Dec. 12, 2023

(54) ALIGNMENT SENSOR BASED ON WAVELENGTH-SCANNING

(71) Applicant: ASML Holding N.V., Veldhoven (NL)

(72) Inventor: Muhsin Eralp, Bethel, CT (US)

(73) Assignee: ASML HOLDING N.V., Veldhoven (NL)

(*) Notice: Subject to any disclaimer, the term of this patent is extended or adjusted under 35 U.S.C. 154(b) by 0 days.

(21) Appl. No.: 17/631,082

(22) PCT Filed: Jul. 22, 2020

(86) PCT No.: PCT/EP2020/070612
§ 371 (c)(1),
(2) Date: Jan. 28, 2022

(87) PCT Pub. No.: WO2021/018676
PCT Pub. Date: Feb. 4, 2021

(65) Prior Publication Data
US 2022/0299892 A1 Sep. 22, 2022

Related U.S. Application Data

(60) Provisional application No. 62/880,715, filed on Jul. 31, 2019.

(51) Int. Cl.
*G03F 9/00* (2006.01)
*G03F 7/00* (2006.01)

(52) U.S. Cl.
CPC .......... *G03F 9/7069* (2013.01); *G03F 7/7085* (2013.01); *G03F 9/7088* (2013.01); *G03F 9/7092* (2013.01)

(58) Field of Classification Search
CPC ...... G03F 7/7085; G03F 7/70633; G03F 7/70; G03F 7/70616–70683; G03F 7/7069;
(Continued)

(56) References Cited

U.S. PATENT DOCUMENTS

| 4,444,501 A | 4/1984 | Schwiesow |
| 6,297,876 B1 | 10/2001 | Brornebroek |

(Continued)

FOREIGN PATENT DOCUMENTS

| CN | 103777476 A | * | 5/2014 | ......... G03F 7/70141 |
| TW | 201327066 A | | 7/2013 | |

(Continued)

OTHER PUBLICATIONS

English translation of CN103777476, published May 7, 2014. (Year: 2014).*

(Continued)

*Primary Examiner* — Christina A Riddle
(74) *Attorney, Agent, or Firm* — Sterne, Kessler, Goldstein & Fox P.L.L.C.

(57) ABSTRACT

An alignment method includes directing an illumination beam with a varying wavelength or frequency towards an alignment target, collecting diffraction beams from the alignment target and directing towards an interferometer. The alignment method also includes producing, by the interferometer, two diffraction sub-beams from the diffraction beams, wherein the diffraction sub-beams are orthogonally polarized, rotated 180 degrees with respect to each other around an alignment axis, and spatially overlapped. The alignment method further includes measuring interference intensity of the diffraction beams based on a temporal phase shift, wherein the temporal phase shift is a function of the varying wavelength or frequency of the illumination beam and a fixed optical path difference between the diffraction beams. The alignment method also includes determining a position of the alignment target from the measured interference intensity.

20 Claims, 13 Drawing Sheets

(58) Field of Classification Search
CPC .... G03F 7/7088; G03F 7/7003; G03F 7/7007; G03F 7/7011; G03F 7/7015; G03F 7/7019; G03F 7/7023; G03F 7/7026; G03F 7/7034; G03F 7/7049; G03F 7/7065; G03F 7/7092; G03F 7/7096; G03F 9/7069; G03F 9/7088; G03F 9/70; G03F 9/7003; G03F 9/7007; G03F 9/7011; G03F 9/7015; G03F 9/7019; G03F 9/7023; G03F 9/7026; G03F 9/7034; G03F 9/7049; G03F 9/7065; G03F 9/7092; G03F 9/7096; G03F 7/706505–706851; G03F 7/70483; G03F 7/705
USPC ...... 355/18, 30, 52–55, 67–77; 356/399–401
See application file for complete search history.

(56) References Cited

U.S. PATENT DOCUMENTS

| | | |
|---|---|---|
| 6,628,406 B1 | 9/2003 | Kreuzer |
| 7,511,799 B2 | 3/2009 | Tel et al. |
| 7,990,543 B1 | 8/2011 | Mello et al. |
| 8,208,121 B2 | 6/2012 | Bijnen et al. |
| 2004/0033426 A1 | 2/2004 | Den Boef et al. |
| 2011/0032500 A1 | 2/2011 | Straaijer |
| 2011/0032535 A1 | 2/2011 | Liesener et al. |
| 2013/0130182 A1 | 5/2013 | Markle et al. |
| 2015/0227061 A1* | 8/2015 | Tinnemans ........... G03F 9/7069 356/509 |
| 2018/0341105 A1 | 11/2018 | Sobolev |
| 2019/0129319 A1 | 5/2019 | Granda et al. |

FOREIGN PATENT DOCUMENTS

| | | | |
|---|---|---|---|
| WO | WO2008/083492 A1 | 7/2008 | |
| WO | WO2014/068116 A1 | 5/2014 | |
| WO | WO2018/233939 A1 | 12/2018 | |
| WO | WO-2018233929 A1 * | 12/2018 | ......... G03F 7/70308 |

OTHER PUBLICATIONS

International Search Report and Written Opinion of the International Searching Authority directed to related International Patent Application No. PCT/EP2020/070612, dated Nov. 9, 2020; 10 pages.

International Preliminary Report on Patentability directed to related InternationalPatent ApplicationNo. PCT/EP2020/070612, dated Feb. 1, 2022; 7 pages.

* cited by examiner

ALIGNMENT SENSOR BASED ON WAVELENGTH-SCANNING

CROSS-REFERENCE TO RELATED APPLICATIONS

This application claims priority of U.S. Provisional Patent Application No. 62/880,715, which was filed on Jul. 31, 2019, and which is incorporated herein in its entirety by reference.

FIELD

The present disclosure relates to alignment apparatuses and systems, for example, alignment sensor apparatuses for lithographic apparatuses and systems.

BACKGROUND

A lithographic apparatus is a machine that applies a desired pattern onto a substrate, usually onto a target portion of the substrate. A lithographic apparatus may be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus includes so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

During lithographic operation, different processing steps may require different layers to be sequentially formed on the substrate. Accordingly, it may be necessary to position the substrate relative to prior patterns formed thereon with a high degree of accuracy. Generally, alignment marks are placed on the substrate to be aligned and are located with reference to a second object. A lithographic apparatus may use an alignment apparatus for detecting positions of the alignment marks and for aligning the substrate using the alignment marks to ensure accurate exposure from a mask. Misalignment between the alignment marks at two different layers is measured as overlay error.

Accordingly, there is a need for a system and method to provide alignment with high accuracy and less variation.

SUMMARY

Embodiments of alignment systems and methods are described in the present disclosure.

One aspect of the present disclosure provides an alignment apparatus that includes an illumination system configured to provide an illumination beam with a varying wavelength or frequency, the illumination beam directed towards an alignment target. The alignment apparatus also includes an interferometer and a detection system configured to collect diffraction beams from the alignment target and direct the diffraction beams towards the interferometer, wherein the interferometer is configured to produce two diffraction sub-beams from the diffraction beams. The alignment apparatus further includes a signal analyzer configured to determine a position of the alignment target based on a temporal phase shift between the diffraction beams, wherein the temporal phase shift between the diffraction beams is a function of the varying wavelength or frequency of the illumination beam and a fixed optical path difference between the diffraction beams.

In some embodiments, the interferometer includes a self-referencing interferometer configured to generate the diffraction sub-beams orthogonally polarized, rotated 180 degrees with respect to each other around an alignment axis of the alignment apparatus, and spatially overlapped on top of each other.

In some embodiments, the alignment apparatus also includes a waveplate configured to change polarization states of the diffraction beams for half pupil of the alignment apparatus.

In some embodiments, the alignment apparatus further includes a phase retarder configured to generate the fixed optical path difference between diffraction beams. In some embodiments, the phase retarder includes a birefringent crystal.

In some embodiments, the detection system also includes an optical device configured to generate a fixed optical path difference between the diffraction beams. In some embodiments, the optical device includes a mirror with a step height for half pupil of the alignment apparatus.

In some embodiments, the detection system is configured to split the illumination beam into illumination sub-beams and provide off-axis illumination towards the alignment target. In some embodiments, the detection system also includes an optical assembly configured to generate a fixed optical path difference between the illumination sub-beams. In some embodiments, the optical assembly includes a retro mirror and a beam splitter.

In some embodiments, the illumination system includes a tunable filter configured to generate the illumination beam with the varying wavelength or frequency.

Another aspect of the present disclosure provides a method for alignment. The method includes directing an illumination beam with a varying wavelength or frequency towards an alignment target, collecting diffraction beams from the alignment target and directing the diffraction beams towards an interferometer. The method also includes producing, by the interferometer, diffraction sub-beams from the diffraction beams, wherein the diffraction sub-beams are orthogonally polarized, rotated 180 degrees with respect to each other around an alignment axis of the alignment apparatus, and spatially overlapped on top of each other. The method further includes measuring an interference intensity of the diffraction beams based on a temporal phase shift between the diffraction beams, wherein the temporal phase shift is a function of the varying wavelength or frequency of the illumination beam and a fixed optical path difference between the diffraction beams. The method further includes determining a position of the alignment target from the measured interference intensity.

In some embodiments, the method also includes changing, by a waveplate, polarization states of the diffraction beams for half pupil of the alignment apparatus.

In some embodiments, the method further includes generating, by a phase retarder, the fixed optical path difference between the diffraction beams. In some embodiments, the phase retarder can be a birefringent crystal.

In some embodiments, the method further includes generating, by an optical device, a fixed optical path difference between the diffraction beams. In some embodiments, the optical device can be a mirror with a step height for half pupil of the alignment apparatus.

In some embodiments, the directing of the illumination beam towards the alignment target comprises irradiating the alignment target at a tilted angle. In some embodiments, the method further includes splitting the illumination beam into illumination sub-beams, and generating a fixed optical path difference between the illumination sub-beams.

In some embodiments, the method also includes generating, by a tunable filter, the illumination beam with the varying wavelength or frequency.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1A:
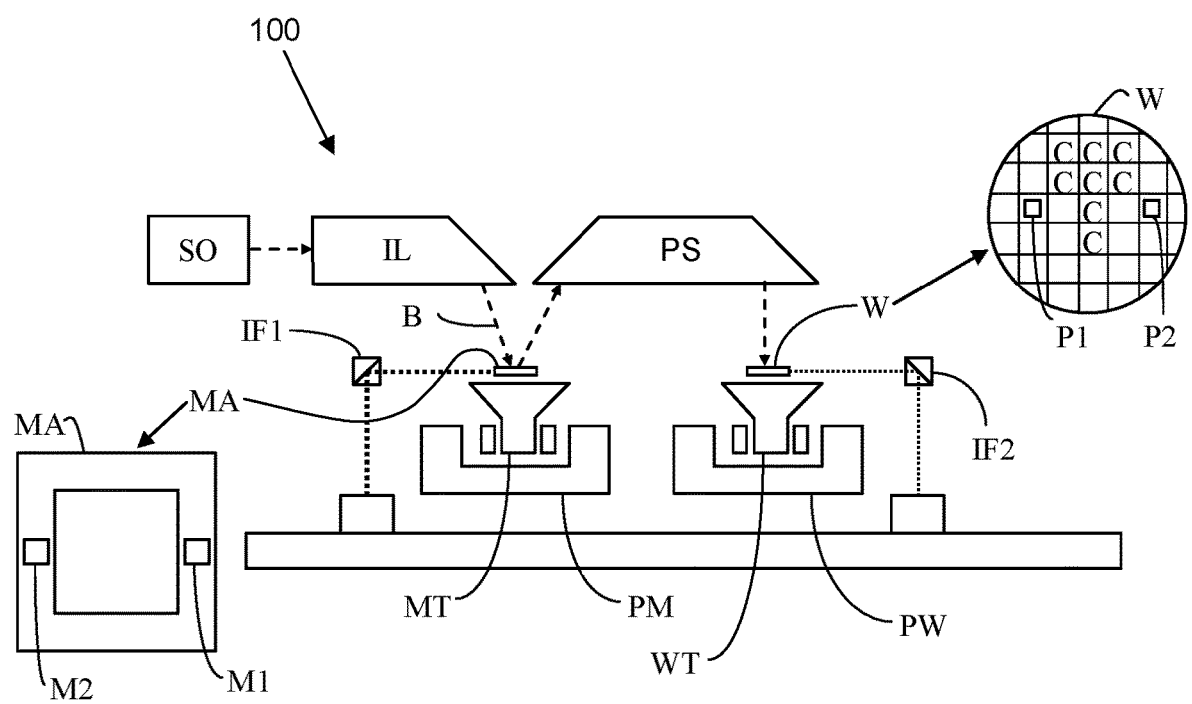
FIG. 1A is a schematic illustration of a reflective lithographic apparatus, according to an exemplary embodiment.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" can indicate a value of a given quantity that varies within, for example, 10-30% of the value (e.g., ±10%, ±20%, or ±30% of the value).

Embodiments of the disclosure may be implemented in hardware, firmware, software, or any combination thereof. Embodiments of the disclosure may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/ or instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure may be implemented.

Example Lithographic Systems

Figure 1B:
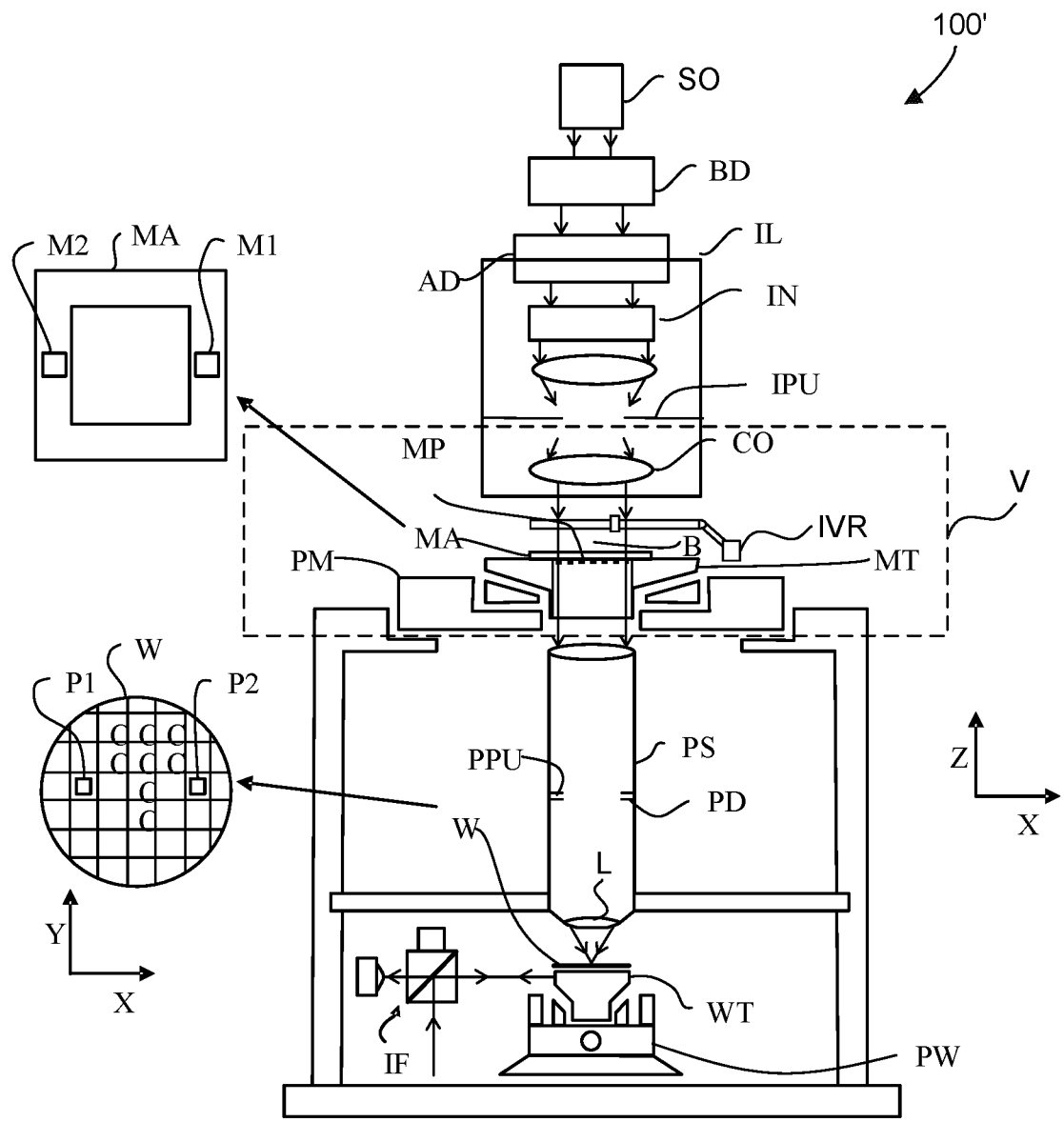
FIG. 1B is a schematic illustration of a transmissive lithographic apparatus, according to an exemplary embodiment.

FIGS. 1A and 1B are schematic illustrations of a lithographic apparatus 100 and lithographic apparatus 100', respectively, in which embodiments of the present invention may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT can be a frame or a table, for example, which can be fixed or movable, as required. By using sensors, the support structure MT can ensure that the patterning device MA is at a desired position, for example, with respect to the projection system PS.

The term "patterning device" MA should be broadly interpreted as referring to any device that can be used to impart a radiation beam B with a pattern in its cross-section, such as to create a pattern in the target portion C of the substrate W. The pattern imparted to the radiation beam B can correspond to a particular functional layer in a device being created in the target portion C to form an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which can be individually tilted so as to reflect an incoming radiation beam in different directions. The tilted mirrors impart a pattern in the radiation beam B, which is reflected by a matrix of small mirrors.

The term "projection system" PS can encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment can be used for EUV or electron beam radiation since other gases can absorb too much radiation or electrons. A vacuum environment can therefore be provided to the whole beam path with the aid of a vacuum wall and vacuum pumps.

Lithographic apparatus 100 and/or lithographic apparatus 100' can be of a type having two (dual stage) or more substrate tables WT (and/or two or more mask tables). In such "multiple stage" machines, the additional substrate tables WT can be used in parallel, or preparatory steps can be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO can be an integral part of the lithographic apparatus 100, 100', for example, when the source SO is a mercury lamp. The source SO and the illuminator IL, together with the beam delivery system BD, if required, can be referred to as a radiation system.

The illuminator IL can include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator can be adjusted. In addition, the illuminator IL can comprise various other components (in FIG. 1B), such as an integrator IN and a condenser CO. The illuminator IL can be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT can be moved accurately (for example, so as to position different target portions C in the path of the radiation beam B). Similarly, the first positioner PM and another position sensor IF1 can be used to accurately position the patterning device (for example, mask) MA with respect to the path of the radiation beam B. Patterning device (for example, mask) MA and substrate W can be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT can be moved accurately (for example, so as to position different target portions C in the path of the radiation beam B). Similarly, the first positioner PM and another position sensor (not shown in FIG. 1B) can be used to accurately position the mask MA with respect to the path of the radiation beam B (for example, after mechanical retrieval from a mask library or during a scan).

In general, movement of the mask table MT can be realized with the aid of a long-stroke module (coarse positioning) and a short-stroke module (fine positioning), which form part of the first positioner PM. Similarly, movement of the substrate table WT can be realized using a long-stroke module and a short-stroke module, which form part of the second positioner PW. In the case of a stepper (as opposed to a scanner), the mask table MT can be connected to a short-stroke actuator only or can be fixed. Mask MA and substrate W can be aligned using mask alignment marks M1, M2, and substrate alignment marks P1, P2. Although the substrate alignment marks (as illustrated) occupy dedicated target portions, they can be located in spaces between target portions (known as scribe-lane alignment marks). Similarly, in situations in which more than one die is provided on the mask MA, the mask alignment marks can be located between the dies.

Mask table MT and patterning device MA can be in a vacuum chamber V, where an in-vacuum robot IVR can be used to move patterning devices such as a mask in and out of vacuum chamber. Alternatively, when mask table MT and patterning device MA are outside of the vacuum chamber, an out-of-vacuum robot can be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' can be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C can be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT can be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO can be employed and the programmable patterning device is updated as required after each movement of the substrate table WT or in between successive radiation pulses during a scan. This mode of operation can be readily applied to maskless lithography that utilizes a programmable patterning device, such as a programmable mirror array.

Combinations and/or variations on the described modes of use or entirely different modes of use can also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
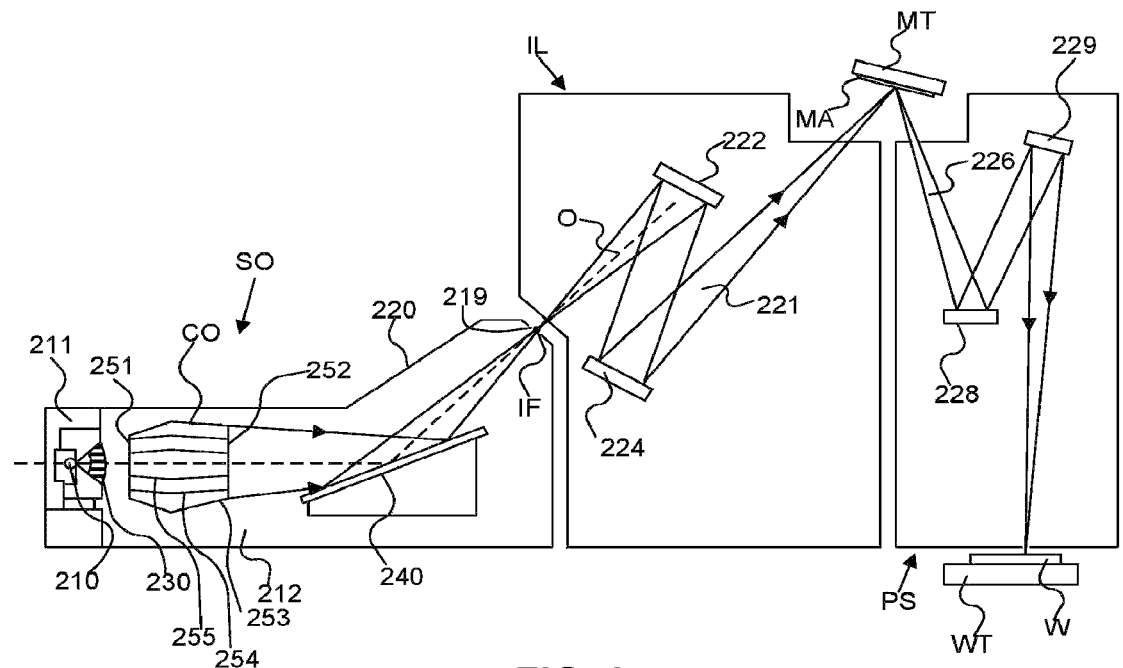
FIG. 2 is a more detailed schematic illustration of the reflective lithographic apparatus, according to an exemplary embodiment.

FIG. 2 shows the lithographic apparatus 100 in more detail, including the source collector apparatus SO, the illumination system IL, and the projection system PS. The source collector apparatus SO is constructed and arranged such that a vacuum environment can be maintained in an enclosing structure 220. The source collector apparatus SO includes a source chamber 211 and a collector chamber 212 and is configured to produce and transmit EUV radiation. EUV radiation may be produced by a gas or vapor, for example Xe gas, Li vapor, or Sn vapor in which an EUV radiation emitting plasma 210 is created to emit radiation in the EUV range of the electromagnetic spectrum. The EUV radiation emitting plasma 210, at least partially ionized, can be created by, for example, an electrical discharge or a laser beam. Partial pressures of, for example, 10 Pa of Xe, Li, Sn vapor, or any other suitable gas or vapor may be required for efficient generation of the radiation. In an embodiment, a plasma of excited tin (Sn) is provided to produce EUV radiation.

The radiation emitted by the EUV radiation emitting 210 is passed from the source chamber 211 into the collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which can be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
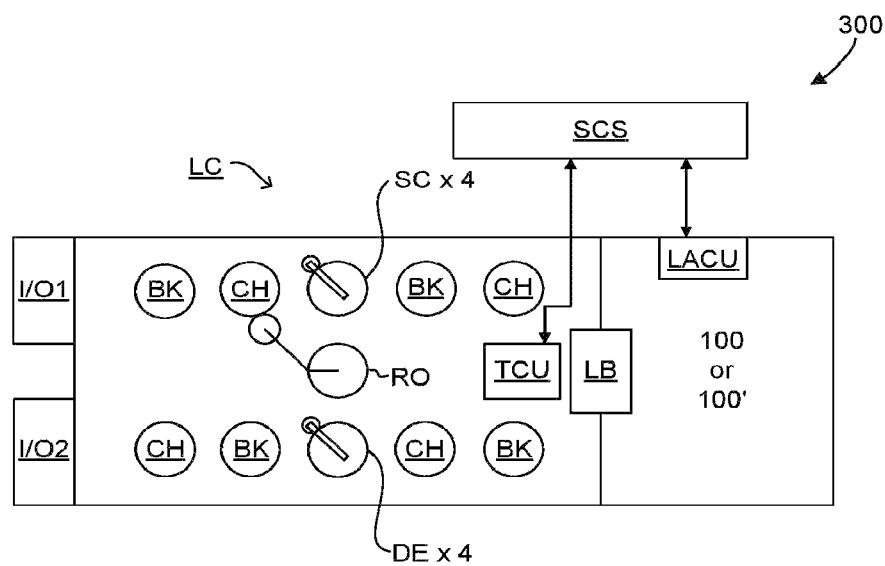
FIG. 3 is a schematic illustration of a lithographic cell, according to an exemplary embodiment.

FIG. 3 shows a lithographic cell 300, also sometimes referred to a lithocell or cluster. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses can be operated to maximize throughput and processing efficiency.

Exemplary Alignment Apparatus using Interference

In order to control the lithographic process to place device features accurately on the substrate, alignment "marks" or "targets" are generally provided on the substrate, and the lithographic apparatus includes one or more alignment apparatuses and/or systems by which positions of marks on a substrate must be measured accurately. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.) and U.S. Pat. No. 6,628,406 (Kreuzer). Generally marks are measured separately to obtain X- and Y-positions. A combined X- and Y-measurement can be performed using the techniques described in U.S. Pat. No. 8,208,121 (Bijnen et al.). The full contents of these disclosures are incorporated herein by reference.

Figure 4:
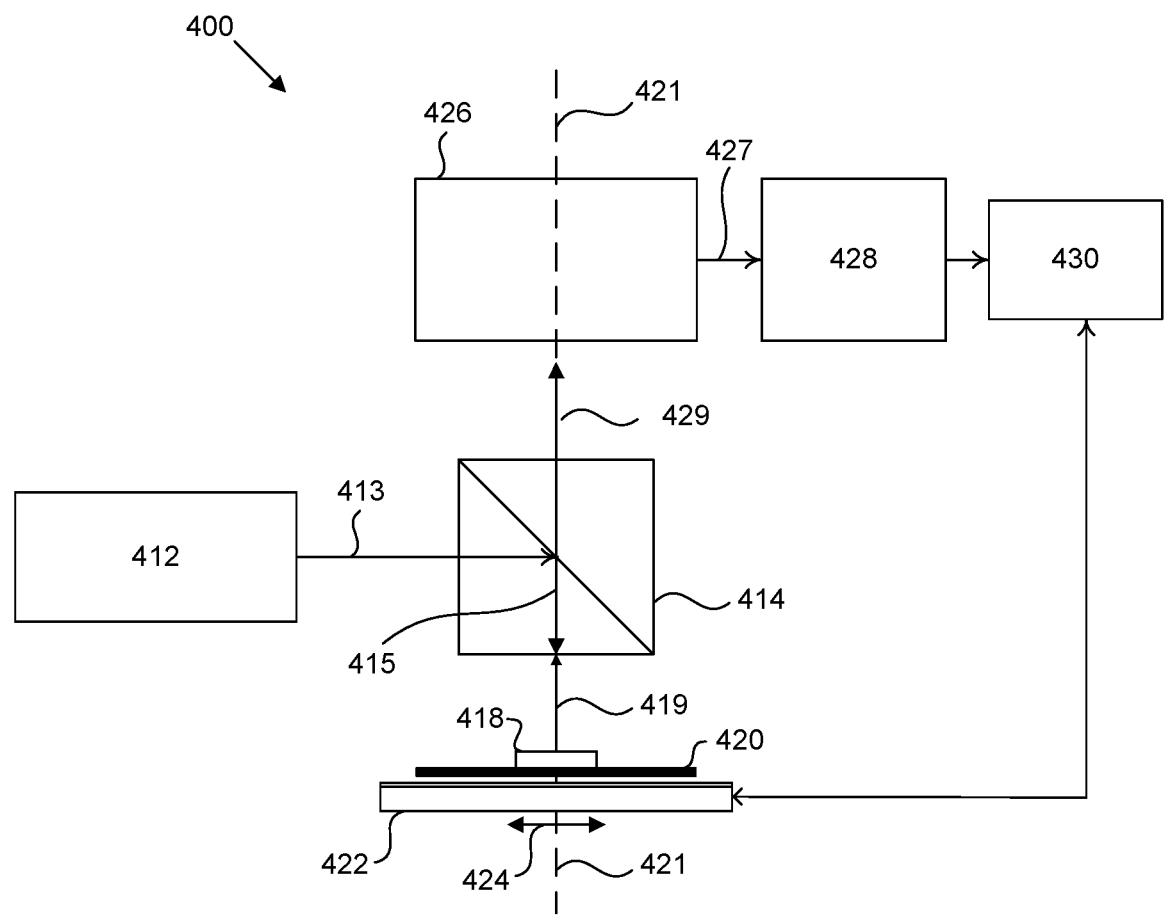
FIG. 4 is a schematic illustration of an alignment apparatus, according to an exemplary embodiment.

FIG. 4 illustrates a schematic of a cross-sectional view of an alignment apparatus 400 that can be implemented as a part of lithographic apparatus 100 or 100', according to an embodiment. In an example of this embodiment, alignment apparatus 400 may be configured to align a substrate (e.g., substrate W) with respect to a patterning device (e.g., patterning device MA). Alignment apparatus 400 may be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate.

According to an embodiment, alignment apparatus 400 may include an illumination system 412, a beam splitter 414, an interferometer 426, a detector 428, and a signal analyzer 430, according to an example of this embodiment. Illumination system 412 may be configured to provide an electromagnetic narrow band radiation beam 413 having one or more passbands. In an example, the one or more passbands may be within a spectrum of wavelengths between about 500 nm to about 900 nm. In another example, the one or more passbands may be discrete narrow passbands within a spectrum of wavelengths between about 500 nm to about 900 nm.

Beam splitter 414 may be configured to receive radiation beam 413 and direct a radiation sub-beam 415 onto a substrate 420 placed on a stage 422. In one example, the stage 422 is movable along direction 424. Radiation sub-beam 415 may be configured to illuminate an alignment mark or a target 418 located on substrate 420. Alignment mark or target 418 may be coated with a radiation sensitive film in an example of this embodiment. In another example, alignment mark or target 418 may have one hundred and eighty degrees (i.e., 180°) symmetry. That is, when alignment mark or target 418 is rotated 180° about an axis of symmetry perpendicular to a plane of alignment mark or target 418, rotated alignment mark or target 418 may be substantially identical to an unrotated alignment mark or target 418. The target 418 on substrate 420 may be (a) a resist layer grating comprising bars that are formed of solid resist lines, or (b) a product layer grating, or (c) a composite grating stack in an overlay target structure comprising a resist grating overlaid or interleaved on a product layer grating. The bars may alternatively be etched into the substrate.

Beam splitter 414 may be further configured to receive diffraction radiation beam 419 and direct diffracted radiation sub-beam 429 towards interferometer 426, according to an embodiment.

In an example embodiment, diffracted radiation sub-beam 429 may be at least a portion of radiation sub-beam 415 that may be reflected from alignment mark or target 418. In an example of this embodiment, interferometer 426 comprises any appropriate set of optical-elements, for example, a combination of prisms that may be configured to form two images of alignment mark or target 418 based on the received diffracted radiation sub-beam 429. Interferometer 426 may be further configured to rotate one of the two images with respect to the other of the two images 180° and recombine the rotated and unrotated images interferometrically. In some embodiments, the interferometer 426 can be a self-referencing interferometer, which is disclosed in U.S. Pat. No. 6,628,406 (Kreuzer) and is incorporated by reference herein in its entirety.

In an embodiment, detector 428 may be configured to receive the recombined image via interferometer signal 427 and detect interference as a result of the recombined image when an alignment axis 421 of alignment apparatus 400 passes through a center of symmetry (not shown) of alignment mark or target 418. Such interference may be due to alignment mark or target 418 being 180° symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. Detector 428 may be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data can for example be obtained with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or ATHENA (Advanced Technology using High order ENhancement of Alignment), as described in U.S. Pat. No. 6,297,876, which directs each of seven diffraction orders to a dedicated detector, which are both incorporated by reference herein in their entireties.

In an embodiment, signal analyzer 430 may be configured to determine a position of stage 422 and correlate the position of stage 422 with the position of the center of symmetry of alignment mark or target 418. As such, the position of alignment mark or target 418 and, consequently, the position of substrate 420 may be accurately known with reference to stage 422.

In some embodiments, detector 428 can be an array of detectors, allowing the possibility of accurate stack profile detection. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that can be read-out at high speed and are especially of interest if phase-stepping detection is used.

Alignment Marks and Diffraction Gratings

Figure 5:
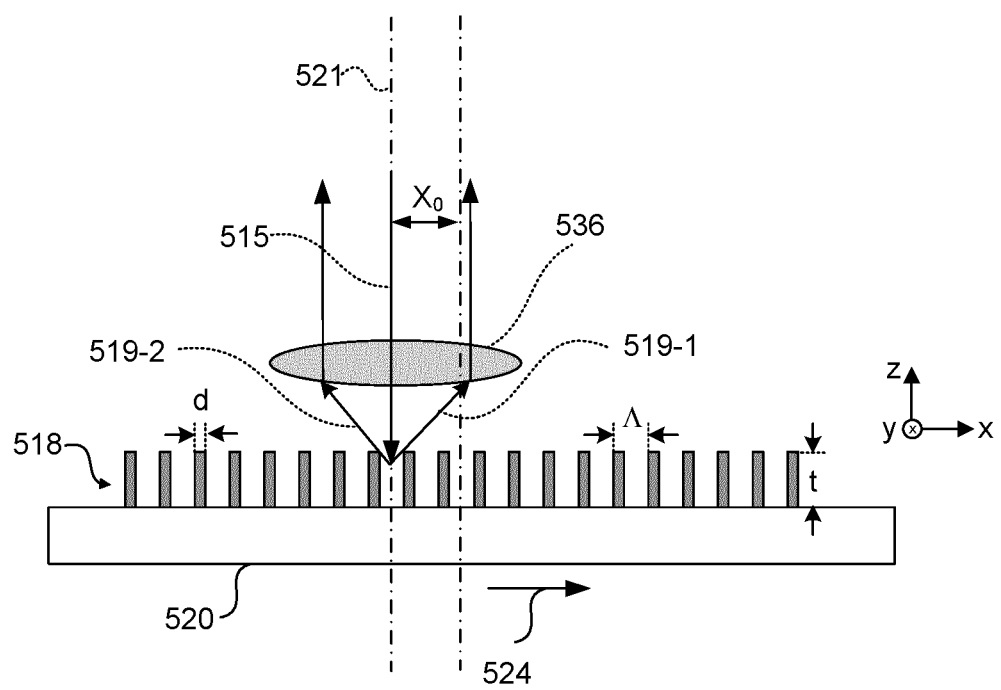
FIG. 5 illustrates an exemplary alignment target designed with a diffraction grating, according to some embodiments of present disclosure.

FIG. 5 shows a cross-sectional view of a diffraction grating 518, according to an embodiment. Diffraction grating 518 can include a pitch or period of "Λ" and a grating line width of "d", formed on a substrate 520. The efficiency of high diffraction orders can be determined by parameters of diffraction grating 518, such as profile of the grating structure (e.g., rectangular shape), film stack thickness "t", duty cycle "F", etc. Duty cycle "F" can be defined as a ratio of grating width d and pitch Λ, i.e., F=d/Λ. Diffraction efficiency can be predicted using rigorous vector wave modeling or various other methods to solve Maxwell's equations which fully describe the electromagnetic fields as light propagates.

In one example, the spectral property (e.g., diffraction angles) of diffraction grating 518 can be described by a grating equation. For example, at normal incidence with a radiation beam 515 having a wavelength of λ, diffraction angle ϑm, of mth order can be predicted by $$\Lambda \sin(\vartheta_m) = m\lambda \text{(normal incidence)} \quad (1)$$

Diffraction gratings can be used as alignment marks. The operation of an alignment system can be based on the phase shift between the two symmetric high order diffractions, for example, between diffraction beams 519-1 and 519-2 with m=+1 and m=−1, respectively. When diffraction grating 518 is not moving, frequency ν of diffraction beams 519-1 and 519-2 can be the same, i.e., ν·λ=c, wherein c is the speed of light. In this example, diffraction beams 519-1 and 519-2 are in phase. If diffraction grating 518 or substrate 520 is moving, for example, along a scanning direction 524 relative to an objective lens 536 or an interferometer (not shown) with a speed Vstage, the frequency of diffraction beam 519-1 can be increased by Δν, while the frequency of diffraction beam 519-2 can be decreased by Δν due to Doppler Effect. The frequency difference can result in a temporal phase shift Δφ(t) when diffraction beams 519-1 and 519-2 arrive at the interferometer, wherein the temporal phase shift Δφ(t) can be expressed as:

$$\Delta\varphi(t) = 2\pi(2\Delta\nu)t = 4\pi \frac{V_{stage}}{\Lambda} t \quad (2)$$

The other higher order diffraction beams follow similar behavior. As such, a light intensity ISUM measured at the output of the interferometer can be a function of an grating offset x0, a shift of a center symmetry of the grating from an alignment axis 521 of the alignment apparatus:

$$I_{SUM} = I_0 + I_1 \cos\left(\frac{4\pi x_0}{\Lambda} + \Delta\varphi(t)\right) \quad (3)$$

By scanning the grating 518, alignment signal is modulated and presented in the temporal modulation of the light intensity ISUM. Through data processing and analysis, noises and other factors can be filtered out and grating offset x0 can be determined by parameter fitting and extraction from the measured light intensity ISUM.

In some embodiments, Equation (3) can be used as a general approach to determine a position of an alignment target, where a total phase shift Ψ includes two components, a temporal phase shift Δφ(t) and a time-independent phase shift φ0, i.e., Ψ=Δφ(t)+φ0. The time-independent phase shift φ0 can be a function of the grating offset x0, i.e.

$$\varphi_0 = \frac{4\pi x_0}{\Lambda}.$$

By introducing the temporal phase shift Δφ(t) in the total phase shift Ψ, light intensity ISUM also becomes a time-dependent function. As such, time-independent phase shift φ0 or grating offset x0 can be determined by curve fitting and/or parameter extracting.

However, the temporal phase shift Δφ(t) can be created by approaches other than grating scanning shown in Equation (2). In some embodiments, temporal phase shift Δφ(t) generated by wavelength scanning is described below.

Exemplary Alignment System Using Wavelength Modulation

Even as lithography systems provide smaller and smaller patterning features at advanced technology nodes for integrated circuits, they also need to increase accurate alignment between different lithography levels receiving smaller and smaller alignment marks or targets. Alignment marks can usually be placed in a scribe lane, an area between chips or dies (product areas) that is subsequently thrown away at die dicing before packaging. For a given process monitoring area, smaller size also allows more alignment marks being distributed at various locations to improve alignment and/or overlay uniformity across the wafer. Alternatively, for a die with large area, smaller alignment marks can be placed inside a die to improve alignment across a product chip.

Currently an interference-based alignment system relies on grating scanning to generate modulated alignment signals. Long alignment marks are thereby designed to provide enough distance for the scanning. In an image-based alignment system, small alignment marks can be used. However, resolution and speed is limited due to large data acquisition and processing.

Various embodiments in accordance with the present disclosure provide apparatus and methods for alignment with small marks by using wavelength modulation or wavelength scanning. Alignment marks as small as 10 μm×10 μm can be sufficient to provide alignment signals with good resolution. In the meantime, the apparatus and methods require no moving parts and can be operated in static mode. Without scanning the grating or moving the wafer stage, vibration issues can be avoided.

Figure 6:
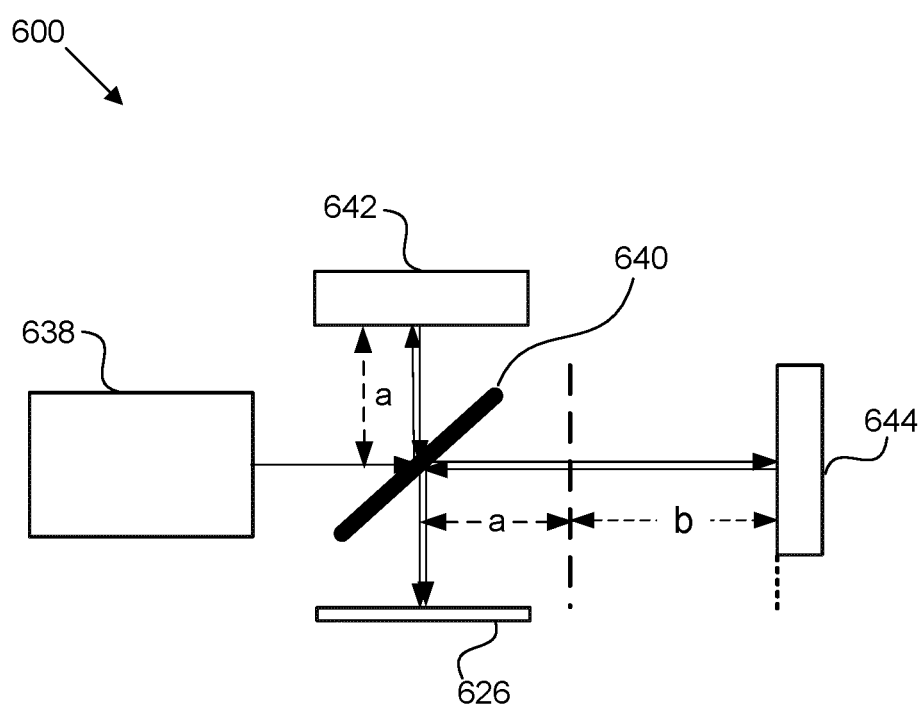
FIG. 6 illustrates an exemplary optical configuration, according to some embodiments of present disclosure.

FIG. 6 illustrates a schematic of an optical system 600, according to an exemplary embodiment. Optical system 600 illustrates the operating principle of phase modulation by using wavelength scanning. In this example, two coherent light beams are generated by an illumination system 638 and a beam splitter 640, wherein the two light beams are reflected at first and second reflective objects 642/644, respectively, and are measured at an interferometer 626. Due to a fixed optical path difference (OPD), light intensity measured at interferometer 626 depends on a phase shift Δφ between the two light beams, wherein $$\Delta\varphi = 2\pi \frac{OPD}{\lambda} = 2\pi \frac{OPD}{c} \nu \quad (4)$$

ν is the frequency of the light beams and fixed OPD=2b in FIG. 6. Dimension b is the difference of distance from the splitter 640 to first and second reflective objects 642/644. Since the light travels to and from first and second reflective objects 642/644, the actual fixed OPD is twice of the dimension b.

As shown in Equation (4), the phase shift Δφ is a function of wavelength λ. Therefore, by sweeping the wavelength λ or frequency ν of the light beams, phase shift Δφ can become a temporal function:

$$\Delta\varphi(t) = \frac{2\pi OPD}{c} \frac{\Delta\nu}{\Delta t} t \quad (5)$$

Substituting the temporal phase shift Δφ(t) in Equation (5) to the light intensity ISUM of the diffraction grating in Equation (3), modulated alignment signals can be generated and thus grating offset x0 of the alignment mark can be determined.

Note that temporal phase shift Δφ(t) in Equation (5) is a linear function of a change of frequency Δν (i.e., a varying frequency or a modulation of frequency). In some embodiment, temporal phase shift $\Delta\varphi(t)$ in Equation (5) can also be expressed as a function of the wavelength $\lambda$, $$\Delta\varphi(t) = -\frac{2\pi OPD}{\lambda^2}\frac{\Delta\lambda}{\Delta t}t \qquad (6)$$

wherein $\Delta\lambda$ is a change of wavelength (i.e., a varying wavelength or a modulation of wavelength).

From the expression of temporal phase shift $\Delta\varphi(t)$ in Equation (5) or (6), an unequal-path (e.g. OPD≠0) between the light beams is necessary to generate temporal phase shift $\Delta\varphi(t)$, in addition to wavelength or frequency modulation of the light beams.

Figure 7A:
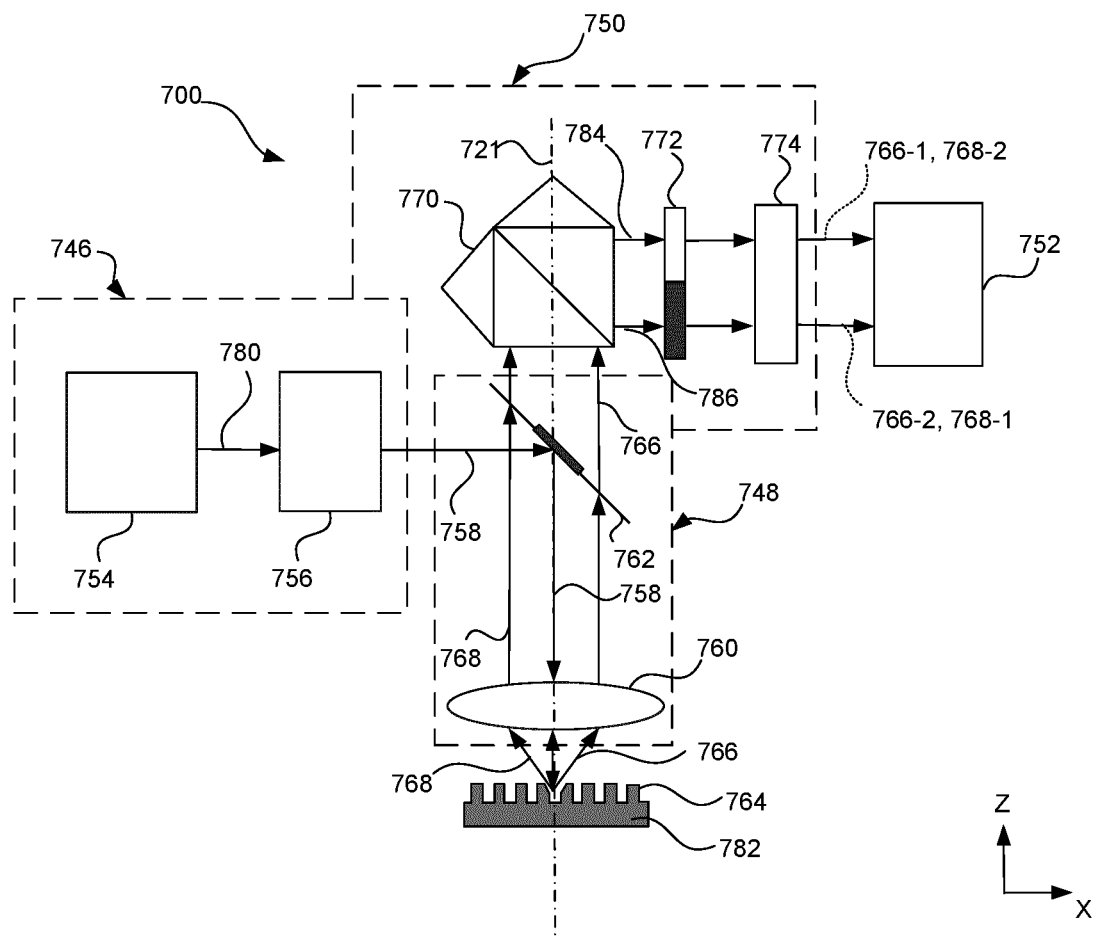
FIGS. 7A, 7B and 7C illustrate an exemplary alignment apparatus, according to some embodiments of present disclosure.

FIG. 7A illustrates an exemplary alignment apparatus 700, according to some embodiments of the present disclosure. Alignment apparatus 700 can be configured to measure a position of an alignment mark based on temporal phase modulation of diffraction beams, wherein the temporal phase modulation is generated through scanning wavelength or frequency of a light source. Alignment apparatus 700 can be built as a part of lithographic apparatus 100 or 100', or can be built as a stand-alone unit in lithography cell or cluster 300 and work together with other apparatuses during operation. In some embodiments, alignment apparatus 700 includes an illumination system 746, a detection system 748, an interferometer 750 and a signal analyzer 752.

The illumination system 746 of alignment apparatus 700 includes a light source 754 and a tunable filter 756, and is configured to provide an illumination beam 758. The detection system 748 includes an objective lens 760 and a spot mirror 762, and is configured to direct the illumination beam 758 towards an alignment target 764, collect diffraction beams (e.g., plus and minus diffraction beams 766 and 768) returned from the alignment target 764, and direct the plus and minus diffraction beams 766/768 towards the interferometer 750. In some embodiments, the interferometer 750 includes a self-referencing interferometer (SRI) 770. In some embodiment, interferometer 750 also includes a waveplate 772 and a phase retarder 774. The interferometer 750 can be configured to produce diffraction sub-beams (e.g., plus and minus diffraction sub-beams 766-1, 766-2, 768-1 and 768-2) from the plus and minus diffraction beams 766 and 768. The signal analyzer 752 can include a detector and a processor (not shown in FIG. 7A) and is configured to determine a position of the alignment target 764 based on a temporal phase shift between the plus and minus diffraction sub-beams (e.g., between 766-1 and 768-2, or between 766-2 and 768-1), wherein the temporal phase shift between the plus and minus diffraction sub-beams (e.g., between 766-1 and 768-2, or between 766-2 and 768-1) is a function of a varying wavelength or frequency of the illumination beam 758.

In some embodiments, light source 754 emits spatially coherent radiation beam 780. In some embodiments, light source 754 can be configured to provide a broadband electromagnetic radiation beam 780, for example, a whitelight with substantially continuous frequencies or wavelengths. In some embodiments, the radiation beam 780 can be visible light or infrared light with a wavelength in a range between about 500 nm to about 700 nm, and about 700 nm to about 2 µm, respectively. In some embodiments, light source 754 can include one or more sources of radiation, each source producing one or more passbands within a spectrum of wavelengths between about 500 nm to about 2 µm. In this example, the radiation beam 780 can be a combination of the one or more passbands from the one or more sources of radiation and can also have substantially continuous wavelengths. In some embodiments, wavelength range of radiation beam 780 can also include ultra-violet.

Tunable filter 756 provides electrical control on radiation beam 780 and produces illumination beam 758. An example of tunable filter 756 can be an acousto-optic tunable filter (AOTF). The optical properties of a specialized birefringent crystal in the AOTF vary upon interaction with an acoustic wave. Changing acoustic frequency with a radio frequency (RF) signal can change diffraction properties of the crystal, and thereby tuning the wavelength of input radiation beam. The central wavelength $\lambda$center of the AOTF passband is determined by $\lambda_{center} \propto V_a \cdot \Delta n_{AOTF}/f$ wherein Va is the acoustic wave velocity, $\Delta$nAOTF is the birefringence of the acousto-optic crystal and f is the acoustic wave frequency. In an example, AOTF can provide central wavelength $\lambda_{center}$ tunable from approximately 400 nm to 650 nm with a line width from about 1 nm to 8 nm. While central wavelength $\lambda$ center of illumination beam 758 is in reverse proportion to the acoustic wave frequency f, the central frequency $\nu$ center can be linearly proportional to the acoustic wave frequency f:

$$\nu_{center} \propto \frac{c}{V_a \cdot \Delta n_{AOTF}}f \qquad (7)$$

Substituting Equation (7) into Equation (5), the temporal phase shift $\Delta\varphi(t)$ can be expressed as:

$$\Delta\varphi(t) \propto \frac{2\pi OPD}{V_a \cdot \Delta n_{AOTF}}\frac{\Delta f}{\Delta t}t \qquad (8)$$

By using tunable filter 756 such as AOTF, the temporal phase shift $\Delta\varphi(t)$ can linearly depend on the modulation of the acoustic wave frequency $\Delta f$ of the AOTF and thereby can be directly controlled by the frequency of applied RF signal on the AOTF. It is noted that tunable filter 756 is not limited to an AOTF. Other filters, such as liquid crystal tunable filter and Fabry-Perot tunable filter, can also be used.

In some embodiments, light source 754 and tunable filter 756 can be replaced by a tunable laser that can produce illumination beam 758 with tunable continuous-wave directly, for example, a dye laser, a titanium-sapphire laser, or a tunable solid-state laser, etc.

In some embodiments, illumination beam 758 can be a polarized beam, for example, having linear polarization, circular polarization or elliptical polarization. Un-polarized irradiation from light source 754 can be changed to a polarized beam by using a polarizer, such as dichroic, crystalline, or wire grid polarizers. Two orthogonal polarization directions of illumination beam 758 can be described as p-polarization and s-polarization. For example, p-polarization has an electric field parallel to the plane of incidence and s-polarization has an electric field perpendicular to the plane of incidence.

In some embodiments, illumination beam 758 is preferably circularly polarized. In an example with alignment target 764 designed with small dimensional diffraction gratings, grating pitch A can be smaller than the wavelength of illumination beam 758. A grating with sub-wavelength pitch may behave as an artificial anisotropic material with so called "form birefringence" optical properties. Due to geometric anisotropy of the grating structure, two orthogonally polarized beams (e.g., parallel and perpendicular to the grating grooves) may encounter different effective refractive indexes and therefore acquire a phase difference. Furthermore, in an example with a sub-wavelength grating, the diffraction efficiency depends on the direction of polarization. In some cases, a sub-wavelength grating can function like a polarizer and only diffract a beam with certain polarization direction. Therefore, circularly polarized incident beam is preferable than linearly polarized beams.

In the example shown in FIG. 7A, spot mirror 762 can be configured to receive illumination beam 758 and direct illumination beam 758 towards alignment target 764 through objective lens 760. Spot mirror 762 can also be configured to collect and direct plus and minus diffraction beams 766 and 768 towards self-referencing interferometer (SRI) 770. In some embodiments, spot mirror 762 can be formed by a transmissive cube with a reflective metal layer disposed in the center of the cube. In some embodiments, spot mirror 762 can be replaced by a beam splitter.

It should be noted that even though spot mirror 762 is shown to reflect illumination beam 758 towards alignment target 764 and to transmit plus and minus diffraction beams 766 and 768 towards SRI 770, the disclosure is not so limiting. It would be apparent to a person skilled in the relevant art that other optical arrangements may be used to obtain similar result.

During the semiconductor manufacturing process, wafers can move beneath the primary lithography lens. How accurately the wafer is positioned under this exposure lens directly determines the quality of semiconductor products. Therefore, alignment marks are placed on the wafer starting from the first lithography level to ensure the precision of wafer position.

Figure 8:
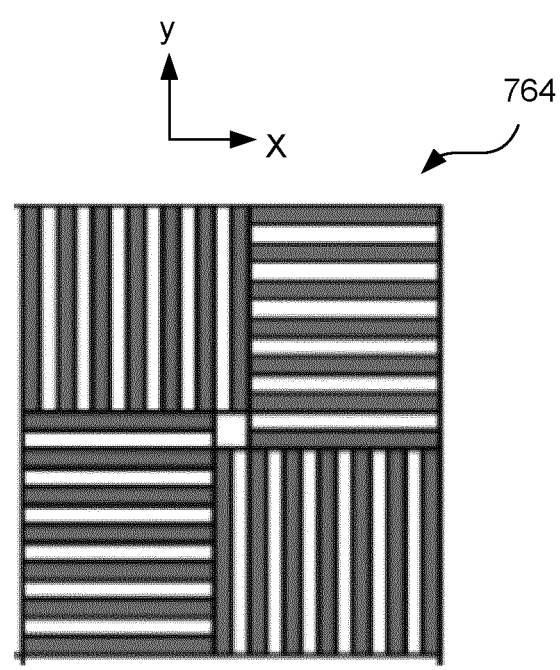
FIG. 8 illustrates an exemplary alignment target designed with two-dimensional diffraction gratings, according to some embodiments of present disclosure.

FIG. 8 illustrates an exemplary alignment mark, according to some embodiments of present disclosure. In some embodiments, the alignment mark can be the alignment target 764 in FIG. 7A. Alignment target 764 can be structures formed on a substrate 782 through pattern transfer using a prior-level lithography mask (not shown in FIG. 7A.) The material and film stack used for the formation of alignment target 764 can depend on the layout of alignment target 764 on the prior-level lithography masks and the processes that the substrate 782 went through. In some embodiments, alignment target 764 can be made of or coated with a radiation sensitive film, for example, photoresist. The design requirement for alignment target 764 (e.g., shape and size) depends on the alignment system and alignment method used. In some embodiments, alignment target 764 can be a one-dimensional grating (as shown in FIG. 5), with a typical duty cycle around 50%. In some embodiments, alignment target 764 can be a two-dimensional array or grating (as shown in FIG. 8). In one example, the spot size of illumination beam 758 is at least larger than the dimension of the alignment target 764 in both x- and y-directions.

Referring back to FIG. 7A, objective lens 760 focuses illumination beam 758 onto alignment target 764 and collects plus and minus diffraction beams 766 and 768 reflected from alignment target 764. It is known to a person skill in the art, other focusing optical systems can also be used to provide similar function.

In some embodiments, plus and minus diffraction beams 766 and 768 from alignment target 764 include symmetrically distributed high orders of diffraction beams, i.e., $m \neq 0$ in Equation (1), for example, +1 and −1, +2 and −2, . . . , +n and −n, . . . , respectively. In this example, plus diffraction beam 766 includes +1, +2, . . . , +n orders of diffraction beams, and minus diffraction beam 768 includes −1, −2, . . . , −n orders of diffraction beams. Different orders of diffraction beams are spatially separated, depending on the diffraction angle ϑm. In some embodiments, the zeroth order of diffraction beam does not contain alignment signal and is blocked or filtered out as background noise. In some embodiments, plus and minus diffraction beams 766 and 768 can be circularly polarized and have wavelength modulated according to tunable filter 756.

Figure 7B:
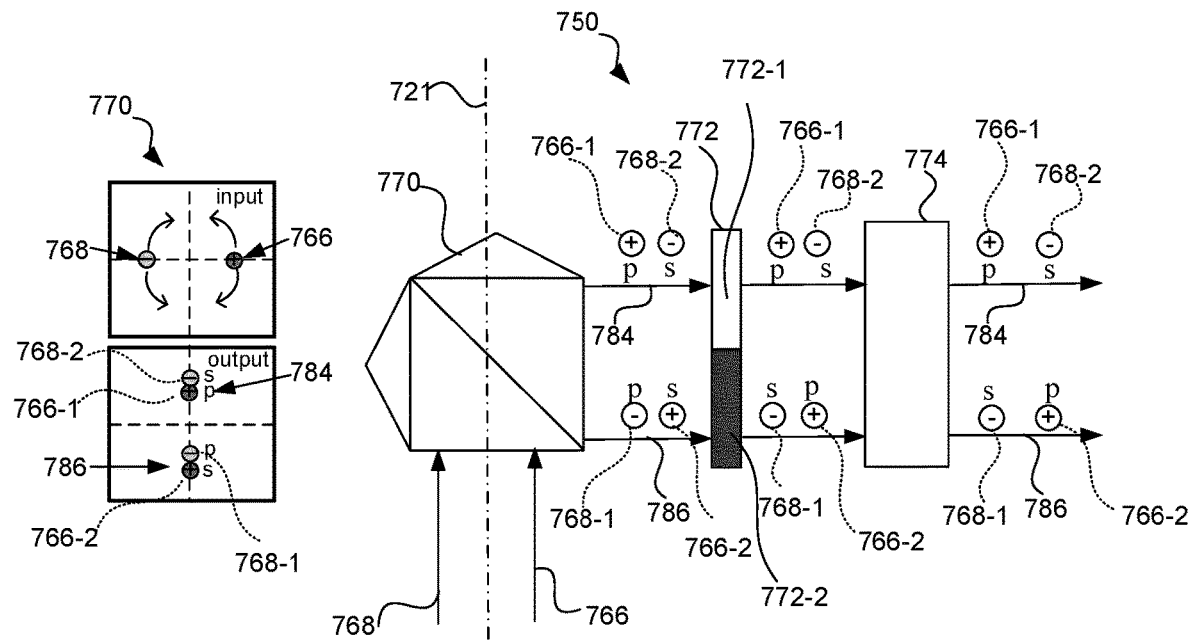

FIG. 7B illustrates an exemplary structure and method of interferometer 750, according to some embodiments of present disclosure. In some embodiments, SRI 770 takes the plus and minus diffraction beams 766 and 768 at an input and produces plus and minus diffraction sub-beams with first and second polarizations, e.g., 766-1, 766-2, 768-1 and 768-2 at an output, wherein the plus and minus diffraction sub-beams are directed onto first and second optical branches 784 and 786. The first and second polarized sub-beams are orthogonally polarized and spatially overlapped. For example, as illustrated in FIG. 7B, SRI 770 splits the plus diffraction beam 766 (e.g., m=+1) with circular polarization onto first optical branch 784 with p-polarized plus diffraction sub-beam 766-1 and second optical branch 786 with s-polarized plus diffraction sub-beam 766-2, by rotating sub-beams 766-1 and 766-2 spatially for +90° and −90° around an alignment axis 721 of the alignment apparatus 700. Similarly, SRI 770 splits the minus diffraction beam 768 with circular polarization onto first optical branch 784 with s-polarized minus diffraction sub-beam 768-2 and second optical branch 786 with p-polarized minus diffraction sub-beam 768-1, by rotating sub-beams 768-2 and 768-1 for −90° and +90° around the alignment axis 721 of the alignment apparatus 700. As such, the first optical branch 784 includes two orthogonally polarized beams, i.e., p-polarized plus diffraction sub-beam 766-1 (e.g., from m=+1 diffraction beam) and s-polarized minus diffraction sub-beam 768-2 (e.g., from m=−1 diffraction beam). The sub-beams 766-1 and 768-2 are spatially overlapped on top of each other at the output, which are drawn separately in FIG. 7B only for clarity. The second optical branch 786 also includes two orthogonally polarized beams, i.e., s-polarized plus diffraction sub-beam 766-2 (e.g., from m=+1 diffraction beam) and p-polarized minus diffraction sub-beam 768-1 (e.g., from m=−1 diffraction beam), and are also spatially overlapped on top of each other. Other high orders of plus and minus diffraction beams 766 and 768 are also split onto first and second optical branches 784 and 786 at output of SRI 770, with p-polarization and s-polarization of each diffraction order separated onto one of the first and second optical branches 784 and 786. Plus and minus diffraction sub-beams with the same order are also rotated 180 degrees with respect to each other around the alignment axis 721, and spatially overlapped on top of each other in first and second optical branches. The plus and minus diffraction sub-beams on each of the first and second optical branches 784 and 786 can include one or more diffraction orders. As such, SRI 770 can produce two images of the alignment target 764, 180 degrees rotated around the alignment axis 721 with respect to each other and spatially overlapped on top of each other.

In some embodiments, polarization directions of plus and minus diffraction sub-beams on the first and second optical branches 784 and 786 can have a different orientation from the description in FIG. 7B after SRI 770. For example, plus diffraction sub-beam 766-1 and 766-2 can have s-polarization on the first optical branch 784 and p-polarization on the second optical branch 786, respectively. Similarly, minus diffraction sub-beam 768-2 and 768-1 can have p-polarization on the first optical branch 784 and s-polarization on the second optical branch 786, respectively.

In some embodiments, polarization direction of the plus and minus diffraction sub-beams (e.g., 766-2 and 768-1) can be altered after SRI 770 through the waveplate 772.

Figure 7C:
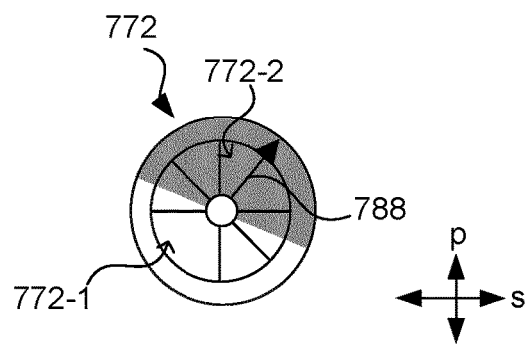

FIG. 7C illustrates an example of waveplate 772, according to some embodiments of present disclosure. In some embodiments, the waveplate 772 changes polarization states of the plus and minus diffraction sub-beams (e.g., 766-2 and 768-1) for half pupil of the alignment apparatus. In this example, waveplate 772 includes two portions. A portion 772-1 is a crystal insensitive to polarization, and a portion 772-2 is a λ/2 (half) wave-plate (HWP) with its fast axis 788 oriented at 45° with respect to the p-polarization or s-polarization direction of the plus and minus diffraction sub-beams (e.g., 766-2 and 768-1) on the second optical branch 786. In this example, the HWP can rotate polarization direction 90° with respect to the incident beam.

In some embodiments, the two portions of the waveplate 772 can be rotated at an angle around propagation direction of the diffraction beams or diffraction sub-beams. For example, the portion 772-2 can be rotated 22.5 degrees, as shown in FIG. 7C. In some embodiments, the portion 772-2 can also be rotated 45 degrees depending on the fast axis orientation.

In some embodiments, waveplate 772 can be configured such that the plus and minus diffraction sub-beams 766-1 and 768-2 of the first optical branch 784 irradiate onto the portion 772-1, and the plus and minus diffraction sub-beams 766-2 and 768-1 of the second optical branch 786 irradiate onto the portion 772-2. Therefore at an output of waveplate 772, plus and minus diffraction sub-beams 766-1 and 768-2 of the first optical branch 784 remain original polarization directions, however plus and minus diffraction sub-beams 766-2 and 768-1 of the second optical branch 786 change polarization direction to p-polarization and s-polarization, respectively. By using waveplate 772, plus and minus diffraction sub-beams of the first and second optical branch 784 and 786 now have the same polarization directions and same alignment signal as well.

In some embodiments, polarization directions of plus and minus diffraction sub-beams on the first and second optical branches 784 and 786 can have a different orientation from the descriptions in FIG. 7B after waveplate 772. For example, plus diffraction sub-beams 766-1 and 766-2 can have s-polarization on the first and second optical branches 784 and 786. Similarly, minus diffraction sub-beams 768-2 and 768-1 can have p-polarization on the first and second optical branches 784 and 786.

In some embodiments, phase retarder 774 can be a birefringent crystal made from materials such as tourmaline, calcite (CaCoO3), sodium nitrate (NaNO3), calomel (Hg2Cl2) or rutile (TiO2). In some embodiments, phase retarder 774 is made from barium borate (αBBO or BaB2O4). Polarized light along a fast axis of a birefringent crystal encounters a lower index of refraction and travels faster through the crystal than light polarized along a slow axis. Therefore, a phase shift (or a fixed optical path difference) can be generated between lights with different polarization directions. The fixed optical path difference (OPD) introduced by the phase retarder 774 can be determined by $$\text{OPD} = \Delta n_{eo} \cdot T \quad (9)$$

where $\Delta n_{eo}$ is the difference of the refraction indexes between fast and slow axes and T is the thickness of the birefringent crystal. By using phase retarder 774, a fixed OPD can be generated between the plus diffraction sub-beams 766-1 and the minus diffraction sub-beams 768-2 on the first optical branch 784. The same fixed OPD can also be generated between the plus diffraction sub-beams 766-2 and the minus diffraction sub-beams 768-1 on the second optical branch 784. Substituting Equation (9) into Equation (8), the temporal phase shift $\Delta\varphi(t)$ can be expressed as:

$$\Delta\varphi(t) = \frac{2\pi \cdot \Delta n_{eo}}{V_a \cdot \Delta n_{AOTF}} \frac{\Delta f}{\Delta t} t \quad (10)$$

In some embodiments, phase retarder 774 other than birefringent crystal can be used and fixed OPD between plus and minus diffraction sub-beams can be different from the description above. In some embodiments, additional fixed OPD can be introduced by other optical devices or components of the alignment apparatus, which is known to a person skilled in the art.

By introducing fixed OPD between the plus and minus diffraction sub-beams in the alignment system and modulating frequency (wavelength) of the radiation beam, temporal phase shift $\Delta\varphi(t)$ can be generated without moving alignment target or stage. In this example, the temporal phase shift $\Delta\varphi(t)$ and alignment signal (e.g., the grating offset x0) can be carried by plus and minus diffraction sub-beams 766-1 and 768-2 in the first optical branch 784 at the output of interferometer 750. In some embodiments, the plus and minus diffraction sub-beams 766-2 and 768-1 on the second optical branch 786 also carry similar temporal phase shift $\Delta\varphi(t)$ and alignment signal at the output of interferometer 750. To determine the position of the alignment target 764, the plus and minus diffraction sub-beams of either the first or the second optical branch 784/786 can be used.

Referring back to FIG. 7A, signal analyzer 752 receives the plus and minus diffraction sub-beams of either the first or second optical branch 784/786, or both. For example, the signal analyzer 752 can receive the plus and minus diffraction sub-beams 766-1 and 768-2 of the first optical branch 784. As described above, the plus and minus diffraction sub-beams 766-1 and 768-2 are orthogonally polarized and spatially overlapped on top of each other. In one example, plus diffraction sub-beam 766-1 can have p-polarization direction and minus diffraction sub-beam 768-2 can have s-polarization direction. The plus and minus diffraction sub-beams 766-1 and 768-2 can have a total phase shift $\Psi = \varphi_0 + \Delta\varphi(t)$, wherein $\Delta\varphi(t)$ is the temporal phase shift discussed above, and $\varphi_0$ is the time independent phase shift, related to grating offset x0

$$\left(\text{e.g., } \varphi_0 = \frac{4\pi x_0}{\Lambda}\right).$$

In some embodiments, signal analyzer 752 can produce interference between the plus and minus diffraction sub-beams (e.g., 766-1 and 768-2) and can determine the position of the alignment target 764 (e.g., grating offset x0) by measuring a light intensity of the interfered plus and minus diffraction sub-beams 766-1 and 768-2 (also referred to as interference intensity), based on Equation (3).

In some embodiments, the plus and minus diffraction sub-beams 766-1 and 768-2 have orthogonal polarizations. To produce interference signals with interference intensity as a function of the total phase shift signal analyzer 752 may also have a polarizing optical element (not shown in FIG.

7A), wherein the polarizing optical element can rotate the polarization directions of the plus and minus diffraction sub-beams 766-1 and 768-2 to the same direction. Subsequently, interference intensity can be measured by the detector and data can be processed by the processor. According to Equations (3), grating offset x0 can be extracted. The polarizing optical element can be a polarizing beam splitter, a dichroic sheet polarizer, a Savart plate or a "wire grid" polarizer.

In summary, in some embodiments the position of the alignment target 764 can be determined by measuring the interference intensity of the plus and minus diffraction sub-beams (e.g., 766-1 and 768-2) after introducing the temporal phase shift $\Delta\varphi(t)$ between the plus and minus diffraction sub-beams (e.g., 766-1 and 768-2). In the other words, the position of the alignment target 764 can be determined based on the temporal phase shift $\Delta\varphi(t)$ between the plus and minus diffraction sub-beams, wherein the temporal phase shift $\Delta\varphi(t)$ is a function of the fixed optical path difference (OPD) between the plus and minus diffraction sub-beams (e.g., 766-1 and 768-2) and the varying wavelength $\Delta\lambda$ or frequency $\Delta v$ of the illumination beam 758. In general, the position of the alignment target can be determined by measuring the interference intensity of diffraction beams after introducing the temporal phase shift $\Delta\varphi(t)$ between diffraction beams.

Figure 9:
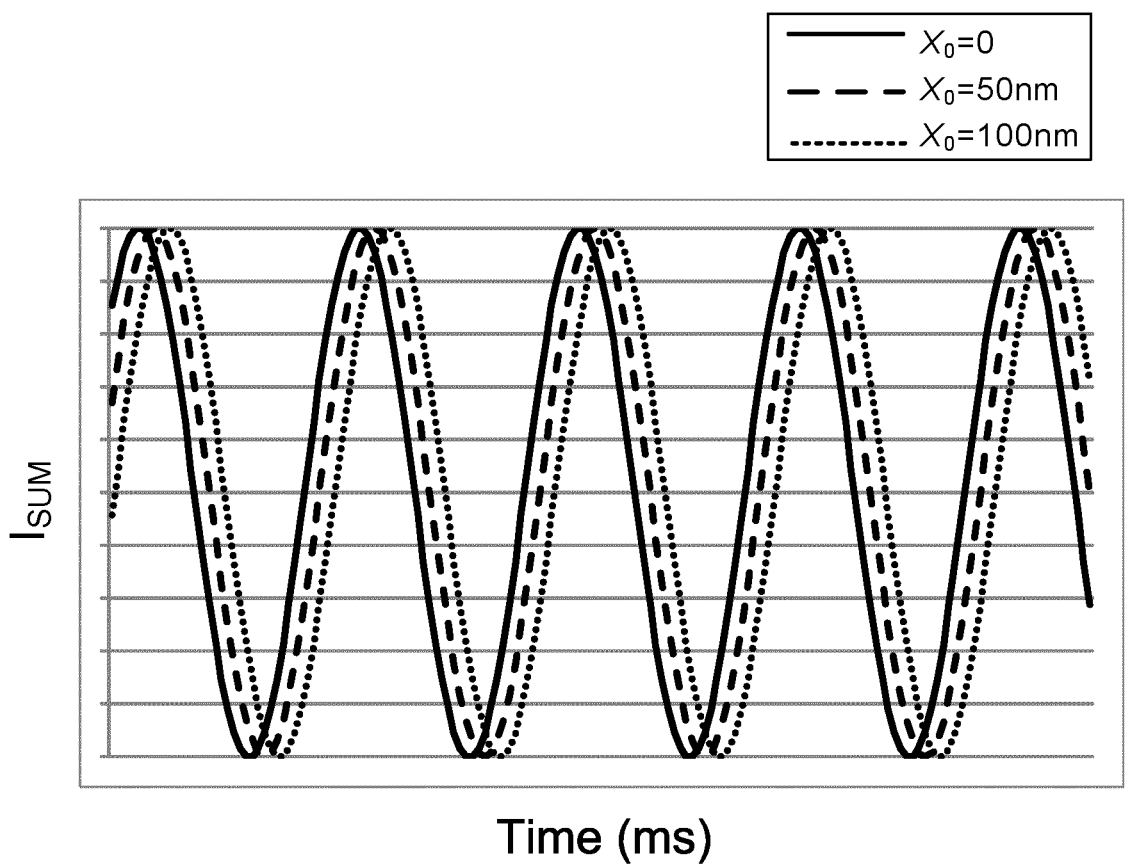
FIG. 9 illustrates an exemplary measurement, according to some embodiments of present disclosure.

FIG. 9 illustrates an exemplary interference intensity measurement based on the interference of plus and minus diffraction sub-beams (e.g., 766-1 and 768-2), according to some embodiments of present disclosure. The solid line corresponds to the grating offset x0=0, the dashed line corresponds to grating offset x0=50 nm, and the dotted line corresponds to grating offset x0=100 nm. From the modulated interference intensity, grating offset x0 can be extracted, while measurement noises and other factors (e.g., fixed unequal path) can be filtered out.

Figure 10:
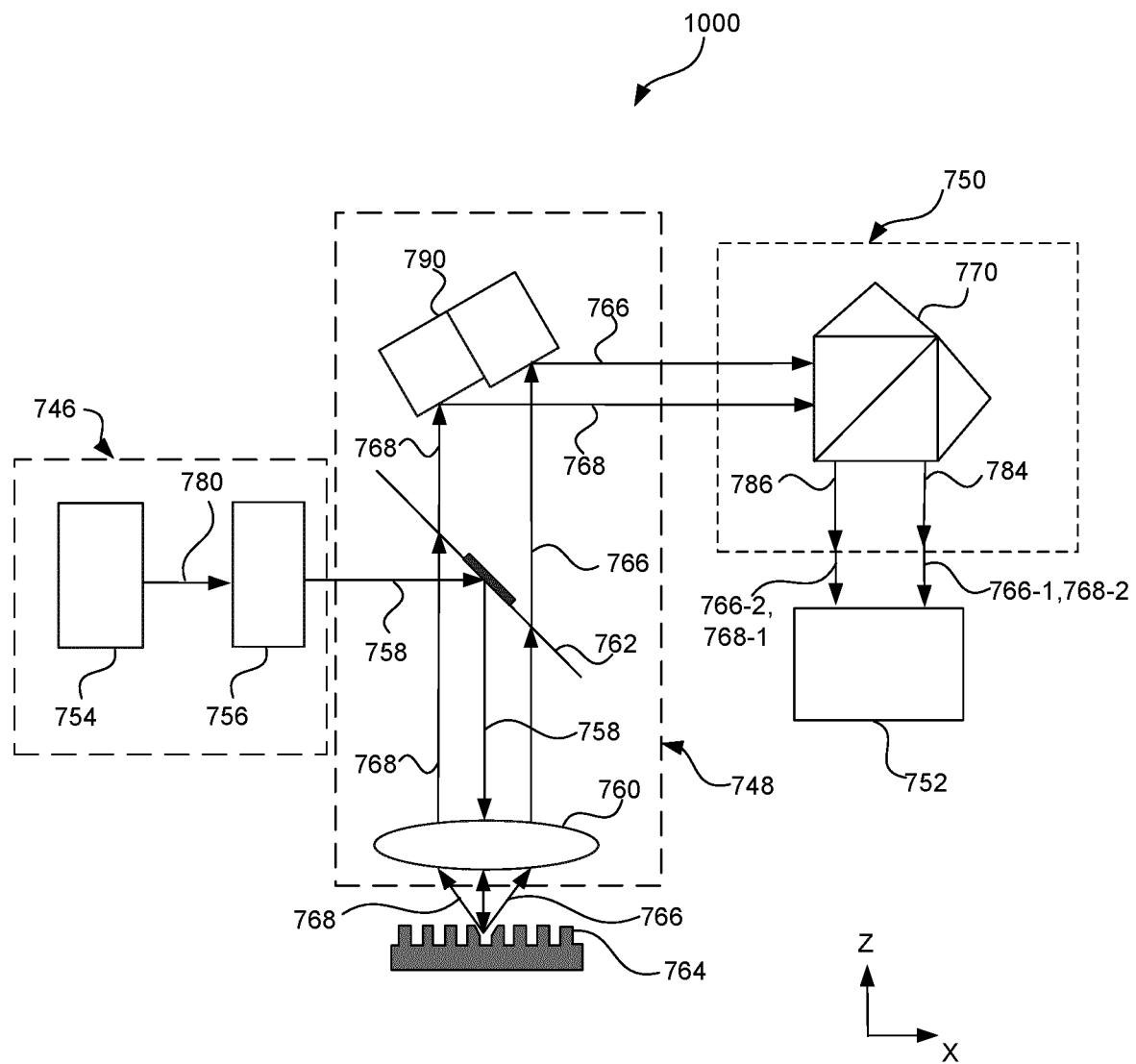
FIG. 10 illustrates another exemplary alignment apparatus, according to some embodiments of present disclosure.

FIG. 10 illustrates an exemplary alignment apparatus 1000, according to some embodiments of present disclosure. Alignment apparatus 1000 is similar to alignment apparatus 700 in FIG. 7A and also includes the illumination system 746, the detection system 748, the interferometer 750 and the signal analyzer 752.

In one example, in alignment apparatus 1000, detection system 748 also includes an optical device 790. The optical device 790 can be a mirror with a step height for half pupil of the alignment apparatus 1000. In this example, a fixed OPD is generated between the plus and minus diffraction beams 766 and 768 before entering the interferometer 750. The magnitude of fixed OPD between the plus and minus diffraction beams 766 and 768 can depend on the step height of the mirror. In some embodiments, the mirror can be oriented with an angle of 22.5° so as to reflect a wide range of diffraction beams from the alignment target 764. In one example, interferometer 750 does not need to include the waveplate 772 or the phase retarder 774 (shown in FIG. 7A).

In some embodiments of alignment apparatus 1000, the fixed OPD between the plus and minus diffraction sub-beams (e.g., 766-1 and 768-2) at an output of the interferometer 750 depends on the fixed OPD between the plus and minus diffraction beams 766 and 768 introduced by the optical device 790. As such, the temporal phase shift $\Delta\varphi(t)$ of plus and minus diffraction sub-beams (e.g., 766-1 and 768-2) can also depend on the fixed OPD between the plus and minus diffraction beams 766 and 768, and can be expected according to Equations (5) and (8).

Figure 11:
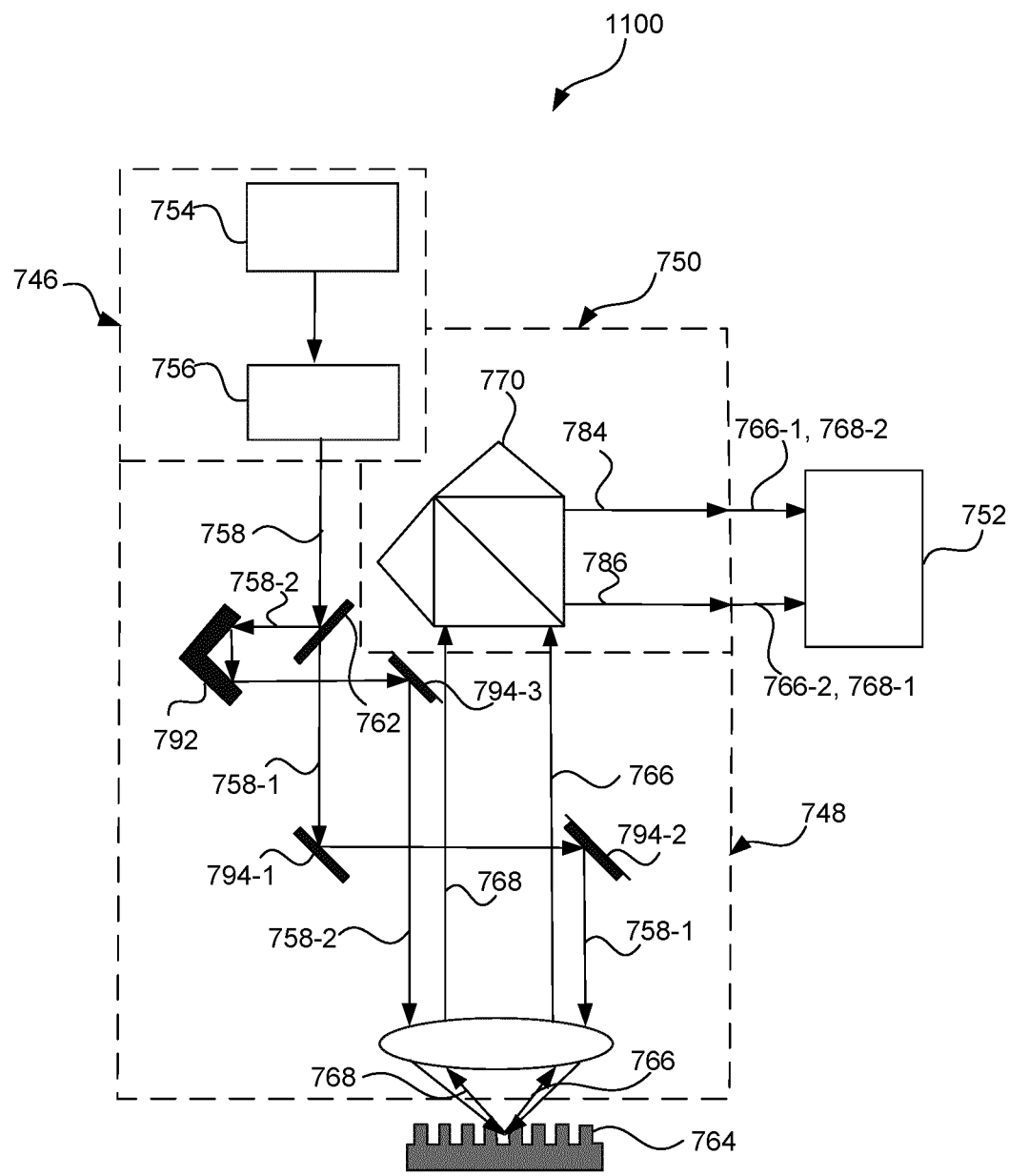
FIG. 11 illustrates an exemplary alignment apparatus with off-axis illumination, according to some embodiments of present disclosure.

FIG. 11 illustrates an exemplary alignment apparatus 1100, according to some embodiments of present disclosure. Alignment apparatus 1100 can be similar to alignment apparatus 700 in FIG. 7A and also includes the illumination system 746, the detection system 748, the interferometer 750 and the signal analyzer 752.

In one example, in alignment apparatus 1100, detection system 748 also includes a retro mirror 792 and an optical assembly such that illumination beam 758 can be split into two illumination sub-beams 758-1 and 758-2 at the spot mirror 762. The optical assembly can also include a plurality of reflecting mirrors 794. Detection system 748 of alignment apparatus 1100 is configured to provide off-axis illumination towards the alignment target 764, where the illumination sub-beams 758-1 and 758-2 irradiate onto the alignment target 764 at an angle, in contrast to normal incidence in FIG. 7A or FIG. 10.

In one example, by using retro mirror 792 and a plurality of reflecting mirrors 794, a fixed OPD is generated between the illumination sub-beams 758-1 and 758-2. In one example, interferometer 750 does not need to include the waveplate 772 or the phase retarder 774 (shown in FIG. 7A). In alignment apparatus 1100, the fixed OPD between the plus and minus diffraction sub-beams (e.g., 766-1 and 768-2) depends on the fixed OPD between the illumination sub-beams 758-1 and 758-2. As such, the temporal phase shift $\Delta\varphi(t)$ of the plus and minus diffraction sub-beams (e.g., 766-1 and 768-2) can also depend on the fixed OPD between the illumination sub-beams 758-1 and 758-2, and can be determined according to Equations (5) and (8). It is noted that the configuration for detection system 748 shown in FIG. 11 is only for illustration purpose. Other optical assemblies or devices can also be used to generate off-axis illumination towards alignment target 764 and generate a fixed OPD between the illumination sub-beams 758-1 and 758-2.

Exemplary Flow Diagram for Alignment with Wavelength Scanning

Figure 12:
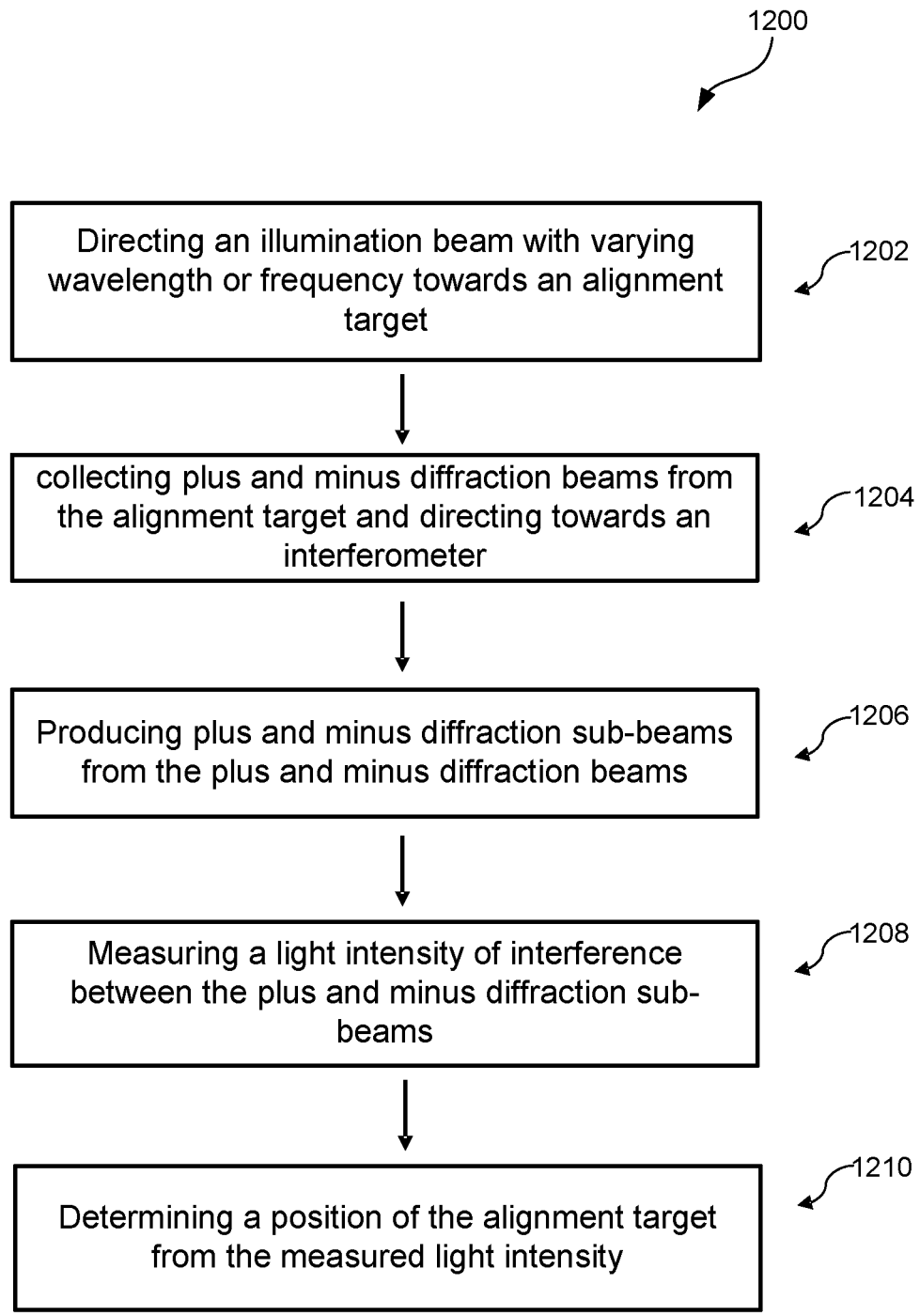
FIG. 12 illustrates an exemplary method for measuring alignment position, according to some embodiments of present disclosure.

FIG. 12 illustrates flow diagram 1200 showing a method for determining a position of an alignment target, according to an embodiment. It is to be appreciated that not all steps in FIG. 12 may be needed to perform the disclosure provided herein. Further, some of the steps may be performed simultaneously, or in a different order than shown in FIG. 12. Flow diagram 1200 shall be described with reference to FIG. 7A. However, flow diagram 1200 is not limited to those example embodiments.

In step 1202, as shown in the example of FIG. 7A, illumination beam 758, with wavelength (frequency) modulated by tunable filter 756, propagates along an illumination path toward spot mirror 762. Spot mirror 762 may direct illumination beam 758 with varying wavelength $\Delta\lambda$ or frequency $\Delta v$ towards objective lens 760, which focuses illumination beam 758 on alignment target 764 on substrate 782.

In step 1204, plus and minus diffraction beams 766 and 768 can be reflected from alignment target 764 and collimated by objective lens 760. Spot mirror 762 may collect plus and minus diffraction beams 766 and 768 from the alignment target 764 and direct towards interferometer 750.

In step 1206, interferometer 750 splits plus and minus diffraction beams 766 and 768 into orthogonally polarized components (e.g., p-polarization or s-polarization) and spatially rotate each component +90° or −90° around an alignment axis 721. As such, at the output, interferometer 750 produces plus and minus diffraction sub-beams from the plus and minus diffraction beams for each of the first and second optical branches 784 and 786. For example, the diffraction sub-beams 766-1 and 768-2 on the optical branch 784 are orthogonally polarized, and contain plus and minus diffraction orders, respectively. Each of the first and second optical branches 784 and 786 can include multiple diffraction orders, and for the same diffraction order, the plus and minus diffraction sub-beams are spatially overlapped on top of each other.

In some embodiments, waveplate 772 can be implemented at the output of interferometer 750 to change polarization states of the plus and minus diffraction sub-beams (e.g., 766-2 and 768-1).

In some embodiments, phase retarder 774 can be implemented to generate a fixed optical path difference between the plus and minus diffraction sub-beams (e.g., 766-1 and 768-2).

In some embodiments, a fixed optical path difference can be introduced by an optical device 790 between the plus and minus diffraction beams 766 and 768.

In some embodiments, a fixed optical path difference can also be created between illumination sub-beams 758-1 and 758-2 in an alignment apparatus with an off-axis illumination.

As such, at the input of signal analyzer 752, the plus and minus diffraction sub-beams (e.g., 766-1 and 768-2) carry the alignment signal (e.g., grating offset x0) and the temporal phase shift $\Delta\varphi(t)$ that is a function of the varying wavelength or frequency of the illumination beam 758 and the fixed optical path difference between the plus and minus diffraction sub-beams.

In step 1208, signal analyzer 752 produces interference between the plus and minus diffraction sub-beams (e.g., 766-1 and 768-2) and measures the interference intensity, where the interference intensity is a temporal function related to the temporal phase shift $\Delta\varphi(t)$ (see Equation (3)) between the plus and minus diffraction sub-beams (e.g., 766-1 and 768-2).

In step 1210, a position of the alignment target 764 (e.g., grating offset x0) can be determined from the measured interference intensity, for example, can be extract from curving fitting of the measured interference intensity.

The embodiments may further be described using the following clauses:

1. An alignment apparatus, comprising:
   an illumination system configured to provide an illumination beam with a varying wavelength or frequency, the illumination beam directed towards an alignment target;
   an interferometer;
   a detection system configured to collect diffraction beams from the alignment target and direct the diffraction beams towards the interferometer, wherein the interferometer is configured to produce two diffraction sub-beams from the diffraction beams; and
   a signal analyzer configured to determine a position of the alignment target by introducing a temporal phase shift between the diffraction beams, wherein the temporal phase shift between the diffraction beams is a function of the varying wavelength or frequency of the illumination beam and a fixed optical path difference between the diffraction beams.

2. The alignment apparatus of clause 1, wherein the interferometer comprises a self-referencing interferometer configured to generate the diffraction sub-beams orthogonally polarized, rotated 180 degrees with respect to each other around an alignment axis of the alignment apparatus, and spatially overlapped on top of each other.

3. The alignment apparatus of clause 1, further comprising a waveplate configured to change polarization states of the diffraction beams for half pupil of the alignment apparatus.

4. The alignment apparatus of clause 1, further comprising a phase retarder configured to generate the fixed optical path difference between the diffraction beams.

5. The alignment apparatus of clause 4, wherein the phase retarder comprises a birefringent crystal.

6. The alignment apparatus of clause 1, wherein the detection system further comprises an optical device configured to generate a fixed optical path difference between the diffraction beams.

7. The alignment apparatus of clause 6, wherein the optical device comprises a mirror with a step height for half pupil of the alignment apparatus.

8. The alignment apparatus of clause 1, wherein the detection system is configured to split the illumination beam into illumination sub-beams and provide off-axis illumination towards the alignment target.

9. The alignment apparatus of clause 8, wherein the detection system further comprises an optical assembly configured to generate a fixed optical path difference between the illumination sub-beams.

10. The alignment apparatus of clause 9, wherein the optical assembly comprises a retro mirror and a beam splitter.

11. The alignment apparatus of clause 1, wherein the illumination system comprises a tunable filter configured to generate the illumination beam with the varying wavelength or frequency.

12. A method comprising:
   directing, towards an alignment target, an illumination beam with a varying wavelength or frequency;
   collecting diffraction beams from the alignment target;
   directing the diffraction beams towards an interferometer;
   producing, by the interferometer, diffraction sub-beams from the diffraction beams, wherein the diffraction sub-beams are orthogonally polarized, rotated 180 degrees with respect to each other around an alignment axis of the alignment apparatus, and spatially overlapped on top of each other;
   measuring a interference intensity of the diffraction beams based on a temporal phase shift between the diffraction beams, wherein the temporal phase shift is a function of the varying wavelength or frequency of the illumination beam and a fixed optical path difference between the diffraction beams; and
   determining a position of the alignment target from the measured interference intensity.

13. The method of clause 12, further comprising:
   changing, by a waveplate, polarization states of the diffraction beams for half pupil of the alignment apparatus.

14. The method of clause 12, further comprising:
   generating, by a phase retarder, the fixed optical path difference between the diffraction beams.

15. The method of clause 14, comprising:
   generating, by a birefringent crystal, the fixed optical path difference between the diffraction beams.

16. The method of clause 12, further comprising:
   generating, by an optical device, a fixed optical path difference between the diffraction beams.

17. The method of clause 16, comprising:
   generating, by a mirror with a step height, the fixed optical path different between the diffraction beams.

18. The method of clause 12, wherein the directing of the illumination beam towards the alignment target comprises irradiating the alignment target at a tilted angle.

19. The method of clause 18, further comprising:
splitting the illumination beam into illumination sub-beams; and
generating a fixed optical path difference between the illumination sub-beams.

20. The method of clause 12, further comprising:
generating, by a tunable filter, the illumination beam with the varying wavelength or frequency.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track unit (a tool that typically applies a layer of resist to a substrate and develops the exposed resist), a metrology unit and/or an inspection unit. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present specification is to be interpreted by those skilled in relevant art(s) in light of the teachings herein.

The term "substrate" as used herein describes a material onto which material layers are added. In some embodiments, the substrate itself may be patterned and materials added on top of it may also be patterned, or may remain without patterning.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical, or other forms of propagated signals, and others. Further, firmware, software, routines, and/or instructions may be described herein as performing certain actions. However, it should be appreciated that such descriptions are merely for convenience and that such actions in fact result from computing devices, processors, controllers, or other devices executing the firmware, software, routines, and/or instructions.

The following examples are illustrative, but not limiting, of the embodiments of this disclosure. Other suitable modifications and adaptations of the variety of conditions and parameters normally encountered in the field, and which would be apparent to those skilled in the relevant art(s), are within the spirit and scope of the disclosure.

Although specific reference may be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention may be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. An alignment apparatus, comprising:
an illumination system configured to provide an illumination beam, the illumination beam being directed towards an alignment target, wherein a wavelength or frequency of the illumination beam is varied or modulated over time;
an interferometer;
a detection system comprising an optical device having at least a mirror and/or a lens and configured to collect diffraction beams from the alignment target and direct the diffraction beams towards the interferometer, wherein the interferometer is configured to produce two diffraction sub-beams from the diffraction beams; and a signal analyzer comprising at least one processor and configured to determine a position of the alignment target by introducing a temporal phase shift between the diffraction beams, wherein the temporal phase shift between the diffraction beams is a function of the varying wavelength or frequency of the illumination beam and a fixed optical path difference between the diffraction beams.

2. The alignment apparatus of claim 1, wherein the interferometer comprises a self-referencing interferometer configured to generate the diffraction sub-beams orthogonally polarized, rotated 180 degrees with respect to each other around an alignment axis of the alignment apparatus, and spatially overlapped on top of each other.

3. The alignment apparatus of claim 1, further comprising a waveplate configured to change polarization states of the diffraction beams for a half pupil of the alignment apparatus.

4. The alignment apparatus of claim 1, further comprising a phase retarder configured to generate the fixed optical path difference between the diffraction beams.

5. The alignment apparatus of claim 4, wherein the phase retarder comprises a birefringent crystal.

6. The alignment apparatus of claim 1, wherein the optical device is configured to generate the fixed optical path difference between the diffraction beams.

7. The alignment apparatus of claim 6, wherein the optical device comprises a mirror with a step height for a half pupil of the alignment apparatus.

8. The alignment apparatus of claim 1, wherein the detection system is configured to split the illumination beam into illumination sub-beams and provide off-axis illumination towards the alignment target.

9. The alignment apparatus of claim 8, wherein the detection system is further configured to generate a fixed optical path difference between the illumination sub-beams.

10. The alignment apparatus of claim 9, wherein the optical device comprises a retro mirror and a beam splitter.

11. The alignment apparatus of claim 1, wherein the illumination system comprises a tunable filter configured to generate the illumination beam with the varying wavelength or frequency.

12. A method comprising:
directing, towards an alignment target, an illumination beam with either a wavelength or frequency that is varied or modulated over time;
collecting diffraction beams from the alignment target;
directing the diffraction beams towards an interferometer;
producing, by the interferometer, diffraction sub-beams from the diffraction beams, wherein the diffraction sub-beams are orthogonally polarized, rotated 180 degrees with respect to each other around an alignment axis of an alignment apparatus, and spatially overlapped on top of each other;
measuring an interference intensity of the diffraction beams based on a temporal phase shift between the diffraction beams, wherein the temporal phase shift is a function of the varying wavelength or frequency of the illumination beam and a fixed optical path difference between the diffraction beams; and
determining a position of the alignment target from the measured interference intensity.

13. The method of claim 12, further comprising:
changing, by a waveplate, polarization states of the diffraction beams for a half pupil of the alignment apparatus.

14. The method of claim 12, further comprising:
generating, by a phase retarder, the fixed optical path difference between the diffraction beams.

15. The method of claim 14, further comprising:
generating, by a birefringent crystal, the fixed optical path difference between the diffraction beams.

16. The method of claim 12, further comprising:
generating, by an optical device, a fixed optical path difference between the diffraction beams.

17. The method of claim 16, further comprising:
generating, by a mirror with a step height, the fixed optical path difference between the diffraction beams.

18. The method of claim 12, wherein the directing of the illumination beam towards the alignment target comprises irradiating the alignment target at a tilted angle.

19. The method of claim 18, further comprising:
splitting the illumination beam into illumination sub-beams; and
generating a fixed optical path difference between the illumination sub-beams.

20. The method of claim 12, further comprising:
generating, by a tunable filter, the illumination beam with the varying wavelength or frequency.

* * * * *

UNITED STATES PATENT AND TRADEMARK OFFICE
CERTIFICATE OF CORRECTION

| | |
|---|---|
| PATENT NO. | : 11,841,626 B2 |
| APPLICATION NO. | : 17/631082 |
| DATED | : December 12, 2023 |
| INVENTOR(S) | : Eralp |

It is certified that error appears in the above-identified patent and that said Letters Patent is hereby corrected as shown below:

In the Specification

In Column 13, Line 29, delete "ISUM" and insert -- $I_{SUM}$ --, therefor.

In Column 13, Line 30, delete "an" and insert -- a --, therefor.

In Column 13, Line 40, delete "ISUM." and insert -- $I_{SUM.}$ --, therefor.

In Column 13, Line 43, delete "ISUM." and insert -- $I_{SUM.}$ --, therefor.

In Column 13, Line 56, delete "ISUM" and insert -- $I_{SUM}$ --, therefor.

In Column 14, Line 61, delete "ISUM" and insert -- $I_{SUM}$ --, therefor.

In Column 19, Line 52, delete "(CaCoO3)," and insert -- (CaCoO$_3$), --, therefor.

In Column 19, Line 52, delete "(NaNO3)," and insert -- (NaNO$_3$), --, therefor.

In Column 19, Line 53, delete "(Hg2Cl2)" and insert -- (Hg$_2$Cl$_2$) --, therefor.

In Column 19, Line 53, delete "(TiO2)." and insert -- (TiO$_2$). --, therefor.

In Column 19, Line 55, delete "BaB2O4)" and insert -- BaB$_2$O$_4$) --, therefor.

In Column 20, Line 66, after "shift", insert -- Ψ, --.

In Column 24, Line 40, delete "a" and insert -- an --, therefor.

Signed and Sealed this
Eleventh Day of June, 2024

Katherine Kelly Vidal
*Director of the United States Patent and Trademark Office*